United States Patent
Benvenuti

(10) Patent No.: US 6,554,970 B1
(45) Date of Patent: Apr. 29, 2003

(54) ARRANGEMENT AND METHOD FOR IMPROVING VACUUM IN A VERY HIGH VACUUM SYSTEM

(75) Inventor: Cristoforo Benvenuti, Moens (FR)

(73) Assignee: Organisation Europeenne pour la Recherche Nucleaire, Geneva (CH)

( * ) Notice: Subject to any disclaimer, the term of this patent is extended or adjusted under 35 U.S.C. 154(b) by 0 days.

(21) Appl. No.: 09/367,930

(22) PCT Filed: Feb. 20, 1998

(86) PCT No.: PCT/EP98/00978

§ 371 (c)(1), (2), (4) Date: Aug. 24, 1999

(87) PCT Pub. No.: WO98/37958

PCT Pub. Date: Sep. 3, 1998

(30) Foreign Application Priority Data

Feb. 26, 1997 (FR) .............................. 97 02305

(51) Int. Cl.⁷ ............................... C23C 14/34
(52) U.S. Cl. ................ 204/192.15; 422/177; 422/178; 422/211
(58) Field of Search ..................... 204/192.15; 427/237, 427/239, 250, 372.2, 404, 405; 422/177, 178, 211

(56) References Cited

U.S. PATENT DOCUMENTS

| 3,630,690 A | 12/1971 | Coppola |
| 4,000,335 A | 12/1976 | Stahl |
| 4,528,003 A | * 7/1985 | Dittrich et al. ............... 55/158 |

FOREIGN PATENT DOCUMENTS

| JP | 01242134 | 9/1989 |
| JP | 03247778 | 2/1990 |

* cited by examiner

*Primary Examiner*—Rodney G. McDonald
(74) *Attorney, Agent, or Firm*—Larson & Taylor PLC

(57) ABSTRACT

The invention concerns an arrangement for improving vacuum in a very high vacuum system (ultrahigh vacuum) comprising a metal chamber releasing gas at its surface, consisting of a coating deposited on at least almost the whole surface of the metal wall defining the chamber. The invention is characterised in that the coating further comprises at least an undercoat of non-evaporating getter deposited on said surface of the metal wall defining the chamber and, on this undercoat, at least a thin film of at least a catalyst selected among ruthenium and/or rhodium and/or palladium and/or osmium and/or iridium and/or platinum and/or an alloy containing at least one of those.

6 Claims, No Drawings

ARRANGEMENT AND METHOD FOR IMPROVING VACUUM IN A VERY HIGH VACUUM SYSTEM

The present invention relates to improvements made with a view to enhancing vacuum in a very high vacuum system (ultrahigh vacuum), comprising a chamber which is capable of releasing gas at its surface.

In a metal system used as a heating chamber in which very high vacuum is generated (i.e. a vacuum of at least $10^{-10}$ Torr $10^{-8}$ Pa), even in the order of $10^{-13}$ to $10^{-14}$ ($10^{-11}$ to $10^{-12}$ Pa)), the metal walls of the chamber constitute an inexhaustible source of gas. The hydrogen contained in the metal structure (for example stainless steel, copper, aluminium alloy) is freely dispersed in the thickness of the metal and is released at the surface defining the chamber. Similarly, when the walls of the vacuum chamber are bombarded by particles (synchrotron, electron or ion radiation)—as is the case in particle accelerators—heavier molecular species are expelled, such as CO, $CO_2$, $CH_4$, produced at the surface after dissociation of hydrocarbons, carbides and oxides.

The vacuum level obtained in the chamber is therefore defined by the dynamic equilibrium between the release of gas at the surface defining the chamber and the pumping rate of the pumps used. Producing high vacuum involves a dual requirement of ensuring that the surface of the chamber is extremely clean so as to reduce the emission of gas and applying a high pumping rate. In the case of vacuum systems for particle accelerators, in which the chambers are generally small in section, either the pumps must be arranged close to one another or pumping has to be applied continuously in order to overcome the conductance limitation.

Under these conditions, a known approach to obtaining as high a vacuum as possible is to supplement the vacuum produced by mechanical pumps by applying complementary pumping, in particular by means of a getter arranged inside the chamber: this material is capable of producing chemically stable compounds by a reaction with the gases present in the vacuum chamber (in particular $H_2$, $O_2$, CO, $CO_2$, $N_2$) and this reaction causes the molecular species concerned to disappear, which is tantamount to a pumping effect.

However, regardless of the pumping process used and irrespective of the distributed efficiency that can be achieved by using a non-evaporable getter, the vacuum level likely to be obtained in the chamber is still defined by the dynamic equilibrium between the pumping rate (regardless of the means used) and the rate at which gas is released from the metal surface of the chamber (irrespective of the cause); in other words, the vacuum level remains dependent on the rate of release of gas inside the chamber for any given pumping rate.

In order to improve the quality of the ultrahigh vacuum inside the chamber, it is therefore desirable to try to reduce significantly the rate at which gases are released at the surface of the metal wall of the chamber and whilst doing to so increase significantly the efficiency of the pumping means.

Accordingly, the objective of the invention is to propose an improved solution that will enable these problems to be overcome and that will reduce the rate at which gas is released inside the chamber and considerably increase the efficiency of the pumping means used, whilst achieving very high or ultrahigh vacuums (in the order of $10^{-10}$ to $10^{-13}$ Torr ($10^{-8}$ to $10^{-11}$ Pa), for example) more economically.

To these ends, the invention proposes an improved arrangement enhancing the ability to produce a very high (ultrahigh) vacuum in a metal chamber from which gases are likely to be released at its surface, consisting of a coating deposited on at least almost the whole surface of the metal wall defining the chamber, which is characterised in that the coating comprises at least an undercoat of non-evaporable getter deposited on said surface of the metal wall defining the chamber and, on this undercoat, at least one thin layer of at least one catalyst selected from ruthenium and/or rhodium and/or palladium and/or osmium and/or iridium and/or platinum and/or an alloy containing at least one of these.

Using an arrangement of this type offers a major advantage in the context of the invention because of the catalyst bodies which can be used and this is attributable to their low oxidation: when these catalysts are exposed to air, they react only slightly with the oxygen at their surface and there is no longer any need to carry out an activation step by heating in order to eliminate the passivation layer.

There is a further advantage, which is attributable to the service life of the catalyst layer, which is unlimited in principle, since the gas absorption is thermally reversible.

This layer of catalyst constitutes a screen which inhibits the release of gas from the metal of the chamber wall, without producing any itself. Furthermore, in the chambers of particle accelerators, it is this layer which is subjected to the impact of the particles or synchrotron radiation and which, forming a screen, prevents the release of molecular species likely to pollute the vacuum in the chamber. Accordingly, with this system, the release of gas, due to whatever cause, is prevented in the chamber, at least to a large degree.

Finally, a catalyst of the type mentioned above is likely to produce a surface pumping effect in respect of the molecular species present in the chamber.

The most interesting results have been obtained using alloys of palladium and more specifically a palladium-silver alloy.

The layer of catalyst can be deposited on the metal wall of the chamber by any appropriate means known to the person skilled in the art and which is expedient in the technical context in question, in particular by electrolytic deposition or by cathode sputtering, as will be explained below.

It should be pointed out, however, that the catalyst has one unfavourable feature which resides in the fact that, unlike a non-evaporable getter, the catalyst will produce a selective pumping effect only: in other words, it is capable of pumping certain molecular species: $H_2$ and CO but not always other molecular species: $N_2$ and $CO_2$. However, in some of the more specific applications considered here (vacuum chambers of particle accelerators), this selectivity may not necessarily be damning due to the fact that majority of the molecular species present are $H_2$ and CO.

Moreover, it should also be pointed out that catalysts exhibiting a pumping effect with respect to the $H_2$ species, and there are a few of them, are limited at low pressure. However, the quantity of $H_2$ pumped can be improved by reducing the temperature: with only a fraction of molecular layer at ambient temperature of approximately 20° C., this quantity is increased as the temperature is lowered. With palladium, for example, which is currently a preferred catalysed due to the results obtained, the equilibrium pressure for a single layer of surface-adsorbed hydrogen is $10^{-7}$ Torr ($10^{-5}$ Pa) at ambient temperature but becomes totally negligible at the boiling temperature of liquid nitrogen (77° K.).

It is in order to remedy the inadequate pumping capacity of the catalyst with respect to certain molecular species, such as $H_2$ and its isotopes, that the invention proposes applying a non-evaporable getter material directly onto the chamber wall. All of the above-mentioned molecular species, such as hydrogen and its isotopes, are therefore transferred from the surface exposed to the vacuum, through the layer of catalyst, as far as the non-evaporable getter layer either over a longer period at ambient temperature or in a more accelerated manner over a shorter period, in some cases very short, by heating to a temperature of about 50 to 70° C. Accordingly, whereas a layer of palladium saturated with $H_2$ enables a vacuum of only $10^{-7}$ Torr ($10^{-5}$ Pa) to be produced at ambient temperature of about 20° C., the same catalyst will produce a vacuum of $10^{-13}$ Torr ($10^{-11}$ Pa) if heated to 70° C.

As far as the layer of non-evaporable getter is concerned, the choice of the component material or materials and how it is produced may be based on any solution known to the person skilled in the art and which will meet the requirements of this invention. However, by preference and of particular advantage are the procedures disclosed in document FR-A-2 750 248 filed in the name of this applicant, to which reference should be made for more detailed information.

It will merely be reiterated that the non-evaporable getter material (NEG) must specifically have a high absorption capacity and a high diffusion capacity in respect of hydrogen and, if possible, the capacity to form a hydride phase; furthermore, it must exhibit a dissociation pressure from the hydride phase of less than $10^{-13}$ Torr ($10^{-11}$ Pa) at approximately 20° C. The material must also have as low an activation temperature as possible, compatible with the heating conditions of vacuum systems (about 400° C. in the case of stainless chambers, 200–250° C. in the case of copper and aluminium alloy chambers) and compatible with the stability of the material on exposure to air at about 20° C.; under these conditions, more generally speaking, the activation temperature must be at most equal to 400° but not less than 150° C.

Finally, titanium, zirconium, hafnium, vanadium and scandium, which exhibit a solubility limit for oxygen of more than 2% at ambient temperature, are appropriate as non-evaporable getters as a means of forming a thin layer coating for the purposes of the invention. Clearly, it would be conceivable to use any alloy or compound of these bodies with others, so as to combine the effects produced, or even to produce new effects which are not a direct result of the sum of the individual effects.

A multi-layer structure as proposed by the invention can be applied in a simple manner:
  at least one thin layer of non-evaporable getter material is deposited on at least almost the whole surface of the wall of the chamber;
  at least one thin layer of at least one catalyst is then deposited on said layer of getter, said catalyst being chosen from ruthenium and/or rhodium and/or palladium and/or osmium and/or iridium and/or platinum and/or an alloy containing at least one of these;
  the chamber is fitted with a vacuum system; and
  the vacuum is formed with the aid of the pumping system.

In the preferred case of deposition by double cathode sputtering, the NEG layer referred to in the first of the steps outlined above is effected by means of at least a first electrode suitable for depositing the getter by cathode sputtering as described in document FR-A-2 750 248. Then, once deposition is complete, this first electrode is removed from the chamber and, before commencing the second of the above-mentioned steps, replaced by at least one second electrode suitable for depositing the catalyst by cathode sputtering. Since the layer of getter is exposed to the ambient air let in whilst changing electrode, it will be necessary to pump and then thermally activate the layer of getter before commencing deposition of the catalyst layer by cathode sputtering.

As an example, this method might be implemented in practice by carrying out the following steps:
  the chamber is cleaned; a device for depositing a thin layer of getter is placed inside the chamber; a relative vacuum is created inside the chamber; the chamber is heated in order to evacuate as much of the water vapour as possible; the getter is then deposited in a thin layer over at least the greater part of the surface of the wall defining the chamber;
  the chamber is restored to atmospheric pressure; and the device used to deposit the getter is removed from the chamber and a device for depositing the catalyst placed in the chamber;
  a relative vacuum is created in the chamber; the installation is heated to the desired temperature whilst maintaining the chamber at a temperature below the activation temperature of the getter;
  heating of the installation is halted and the temperature of the chamber is simultaneously raised to the activation temperature of the getter at which it is maintained for a predetermined period (for example 1 to 2 hours); and, finally, the temperature of the chamber is brought down to ambient temperature; at the end of this procedure, the surface of the thin layer is clean and is thermal release of gas sharply reduced;
  finally, at least one layer of catalyst is deposited on the NEG layer.

In order to avoid the constraints caused by the changeover of electrodes (exposure of the getter layer to the ambient air), it would be conceivable to install, from the outset, a double electrode incorporating simultaneously both the non-evaporable getter and catalyst materials which could then be excited in sequence so that the getter and then the catalyst can be deposited in succession without any intermediate processing of the getter; to produce homogeneous deposits across the entire wall of the chamber, an electrode of this type could be rotated.

Once the final vacuum system is installed, the surface of the catalyst layer is then coated in principle with several single layers of water vapour, which has to be removed by pumping. The removal process will be more rapid if pumping is accompanied by heating the vacuum system, bringing it to a temperature of at least 120° C. and up to 300° C. if possible.

A catalyst used in the form of a layer as described above extends across the entire length of the chamber and therefore retains the advantage of a distributed pumping action in a uniform manner. Furthermore, a layer of catalyst as proposed by the invention does not take up a significant amount of space and brings with it the advantage of producing a pumping effect without any further space requirement, which means that it can be used even in situations where geometric constraints would normally not allow the use of a pumping material in ribbon form.

What is claimed is:

1. A method of applying a layer having a getter function adapted to generating, due to a getter effect, a vacuum in a chamber defined by a metal wall which possibly may release gas at its surface, said layer having a getter function being deposited on at least almost the whole surface of the chamber wall, wherein:

at least a thin layer of non-evaporable getter is deposited, by cathode sputtering, on at least almost the whole surface of the chamber wall, said getter being adapted to absorb hydrogen and isotopes thereof and being selected from titanium and/or zirconium and/or hafnium and/or vanadium and/or scandium and/or an alloy or metal compound including at least one of these;

then at least a thin layer of at least a catalyst is deposited, by cathode sputtering, on said non-evaporable getter layer, said catalyst being selected from ruthenium and/or rhodium and/or palladium and/or osmium and/or iridium and/or platinum and/or an alloy including at least one of these;

the electrode used for the cathode sputtering being removed after the end of the layer deposition;

the vacuum chamber is assembled; and vacuum is generated with a pumping system;

whereby said layer stops gas released by the chamber wall, on one hand, and pumps hydrogen and isotopes thereof present in the chamber when vacuum is generated, on another hand.

2. The method according to claim 1, wherein the catalyst is deposited on the non-evaporable getter layer which has been deposited beforehand without any exposure to the ambient atmosphere between the two deposition steps.

3. The process according to claim 1, wherein the non-evaporable getter layer, which has been exposed to the ambient atmosphere after having been deposited, is then pumped and thermally activated before depositing the layer of catalyst thereon.

4. The process according to claim 1, wherein, at the same time the vacuum is generated with the pumping system, the vacuum system is dried by being heated to a temperature of at least 120° C.

5. The process according to claim 1, wherein the catalyst is an alloy of palladium.

6. The process according to claim 5, wherein the catalyst is a palladium-silver alloy.

* * * * *